(12) United States Patent
Seo

(10) Patent No.: US 8,830,763 B2
(45) Date of Patent: Sep. 9, 2014

(54) SEMICONDUCTOR DEVICE AND OPERATING METHOD THEREOF

(75) Inventor: Shin Won Seo, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 131 days.

(21) Appl. No.: 13/602,020

(22) Filed: Aug. 31, 2012

(65) Prior Publication Data

US 2013/0163360 A1    Jun. 27, 2013

(30) Foreign Application Priority Data

Dec. 22, 2011 (KR) ........................ 10-2011-0139983

(51) Int. Cl.
*G11C 16/16* (2006.01)

(52) U.S. Cl.
USPC .................................................... 365/185.22

(58) Field of Classification Search
CPC ....................................................... G11C 16/16
USPC .................................................... 365/185.22
See application file for complete search history.

(56) References Cited

U.S. PATENT DOCUMENTS

| | | | |
|---|---|---|---|
| 2009/0290427 A1* | 11/2009 | Park | 365/185.22 |
| 2010/0271861 A1* | 10/2010 | Kitagawa | 365/148 |
| 2012/0206972 A1* | 8/2012 | Shiino et al. | 365/185.19 |

* cited by examiner

*Primary Examiner* — Huan Hoang
*Assistant Examiner* — Min Huang
(74) *Attorney, Agent, or Firm* — William & Park Associates Patent Ltd.

(57) ABSTRACT

A semiconductor device and an operating method thereof comprise peripheral circuits configured to apply an erase voltage to memory cells when performing an erase operation, and sense a voltage change of bit lines by an erase verification voltage applied to word lines of the memory cells when performing an erase verification operation to thereby detect cells which are not erased, and a control circuit configured to control the peripheral circuits by changing a sensing reference level for determining the voltage change of the bit lines when the cells which are not erased are detected when performing the erase verification operation, so that the erase verification operation is repeatedly performed.

13 Claims, 7 Drawing Sheets

SEMICONDUCTOR DEVICE AND OPERATING METHOD THEREOF

CROSS-REFERENCE TO RELATED APPLICATION

This application claims priority to and the benefit under 35 U.S.C. 119(a) of Korean Patent Application No. 10-2011-0139983, filed on Dec. 22, 2011, in the Korean Intellectual Property Office, the disclosure of which is incorporated by reference herein in its entirety.

BACKGROUND

1. Field of Invention

The present invention relates to a semiconductor device and an operating method thereof. More specifically, the present invention relates to a semiconductor device for improving reliability of an erase operation and an operating method thereof.

2. Description of the Related Art

A semiconductor device includes a memory cell array composed of a plurality of cell blocks, and a plurality of peripheral circuits for storing data in the memory cell array, or reading or erasing the stored data.

The peripheral circuit includes a low decoder that selects one cell block from the plurality of cell blocks included in the memory cell array, and transmits an operation voltage to word lines of the selected cell block; a voltage generation circuit that generates an operation voltage in accordance with a programming command, a read command, or an erase command and transmits the generated programming command and read or erase command to the low decoder; a plurality of page buffers that are connected to bit lines of the memory cell array to change potentials of the bit lines at the time of reading or erasing or detect changes in the potentials of the bit lines; a column selection circuit that selects the page buffer in accordance with a column address and transmits program data to the selected page buffer or receives data from the selected page buffer; an input/output circuit that inputs and outputs data; and a control circuit that controls the low decoder, the voltage generation circuit, the page buffer, the column selection circuit, and the input/output circuit.

The semiconductor device including the above-described circuits performs a program, a read operation, or an erase operation in accordance with an operation command and an address, where the operation command may be input to the control circuit. Of these, the erase operation will be described as follows.

The erase operation is performed in an incremental step pulse erase (ISPE) scheme that gradually increases an erase voltage. When the erase operation starts, all memory cells included in the selected cell blocks are erased by applying a ground voltage (0 V) to the word lines of the selected cell block, and applying an erase voltage to a well of the selected cell block.

Subsequently, an erase verification operation is performed to determine whether threshold voltages of all of the memory cells included in the selected cell block are reduced to an erase reference voltage. When the threshold voltages of all of the memory cells included in the selected cell block have reached the erase reference voltage based as shown by a result of the erase verification operation, the erase operation with respect to the selected cell block is terminated. If there are memory cells which have not reached the erase reference voltage, the erase operation is repeatedly performed while gradually increasing the erase voltage until the threshold voltages of all of the memory cells of the selected cell block have reached the erase reference voltage.

Among the above-described operations, with regard to the erase verification operation, the selected bit lines are pre-charged, and then the selected cells are determined as cells which are not erased when a current of the bit line that is changed in accordance with turn-on or turn-off of the memory cell is higher than a fixed sensing reference level after having been subjected to the erase operation. The selected cells are determined as cells which are erased when the current is lower than the sensing reference level.

Meanwhile, electrical characteristics of the semiconductor device are gradually deteriorated when the semiconductor device is used, and particularly, deterioration occurs in a junction of the memory cells, and therefore an amount of current passing through the junction may be gradually reduced. If electrical characteristics of the semiconductor device have deteriorated, a current that can be measured when performing an erase verification operation becomes higher than the sensing reference level even when the same erase operation is performed, and therefore the cells which are completely erased may be erroneously determined as program cells (cells which are not completely erased), thereby reducing reliability of the semiconductor device.

SUMMARY OF THE INVENTION

The present invention is directed to a semiconductor device and an operating method thereof, which may perform an additional erase verification operation in which a sensing reference level of the erase verification operation is increased when a normal erase verification operation fails when performing an erase operation, and therefore cells which are completely erased but are erroneously determined as cells which are not completely erased may be determined as cells which are completely erased.

One aspect of the present invention provides a semiconductor device including: peripheral circuits that apply an erase voltage to memory cells when performing an erase operation, and sense a voltage change of bit lines by an erase verification voltage applied to word lines of the memory cells when performing an erase verification operation to thereby detect cells which are not erased; and a control circuit that controls the peripheral circuits by changing a sensing reference level for determining the voltage change of the bit lines when the cells which are not erased are detected when performing the erase verification operation, so that the erase verification operation is repeatedly performed.

Another aspect of the present invention provides an operating method of a semiconductor device, including: applying an erase voltage to memory cells; performing a first erase verification operation for applying an erase verification voltage to word lines of the memory cells and sensing a voltage change of bit lines by the erase verification voltage on the basis of a first sensing reference level to thereby detect cells which are not erased from among first memory cells associated with the bit lines; performing an additional first erase verification operation for changing the first sensing reference level to a second sensing reference level when the cells which are not erased are detected from among the first memory cells; repeatedly performing an erase operation for erasing the memory cells when cells which are not erased are detected when performing the first additional erase verification operation; performing a second erase verification operation for applying the erase verification voltage to the word lines and sensing a voltage change of odd bit lines by the erase verification voltage on the basis of the first sensing reference level to thereby detect cells which are not erased, from among second memory cells associated with the odd bit lines, when the first memory cells are all erased; performing an additional second erase verification operation on the basis of the second sensing reference level, when cells which are not erased are detected from among the second memory cells; repeatedly performing the erase operation when cells which are not erased are detected when performing the additional second erase verification operation; and terminating the erase operation when all the second memory cells are erased.

Still another aspect of the present invention provides an operating method of a semiconductor device, including: applying an erase voltage to memory cells; performing an erase verification operation for detecting cells which are not erased on the basis of a first sensing reference level, with respect to each of memory cell groups associated with even or odd word lines or even or odd bit lines among the memory cells; performing an additional erase verification operation by changing the first sensing reference level to a second sensing reference level before performing the erase verification operation of a next memory cell group when cells which are not erased are detected when performing the erase verification operation; repeatedly performing the erase operation by increasing the erase voltage when cells which are not erased are detected when performing the additional erase verification operation; and terminating the erase operation when the cells which are not erased are not detected from among the memory cell groups.

BRIEF DESCRIPTION OF THE DRAWINGS

The above and other features and advantages of the present invention will become more apparent to those of ordinary skill in the art by describing in detail example embodiments thereof with reference to the attached drawings in which.

DETAILED DESCRIPTION OF EMBODIMENTS

The present invention will be described more fully hereinafter with reference to the accompanying drawings, in which example embodiments of the invention are shown. This invention may, however, be embodied in different forms and should not be construed as limited to the embodiments set forth herein.

Figure 1:
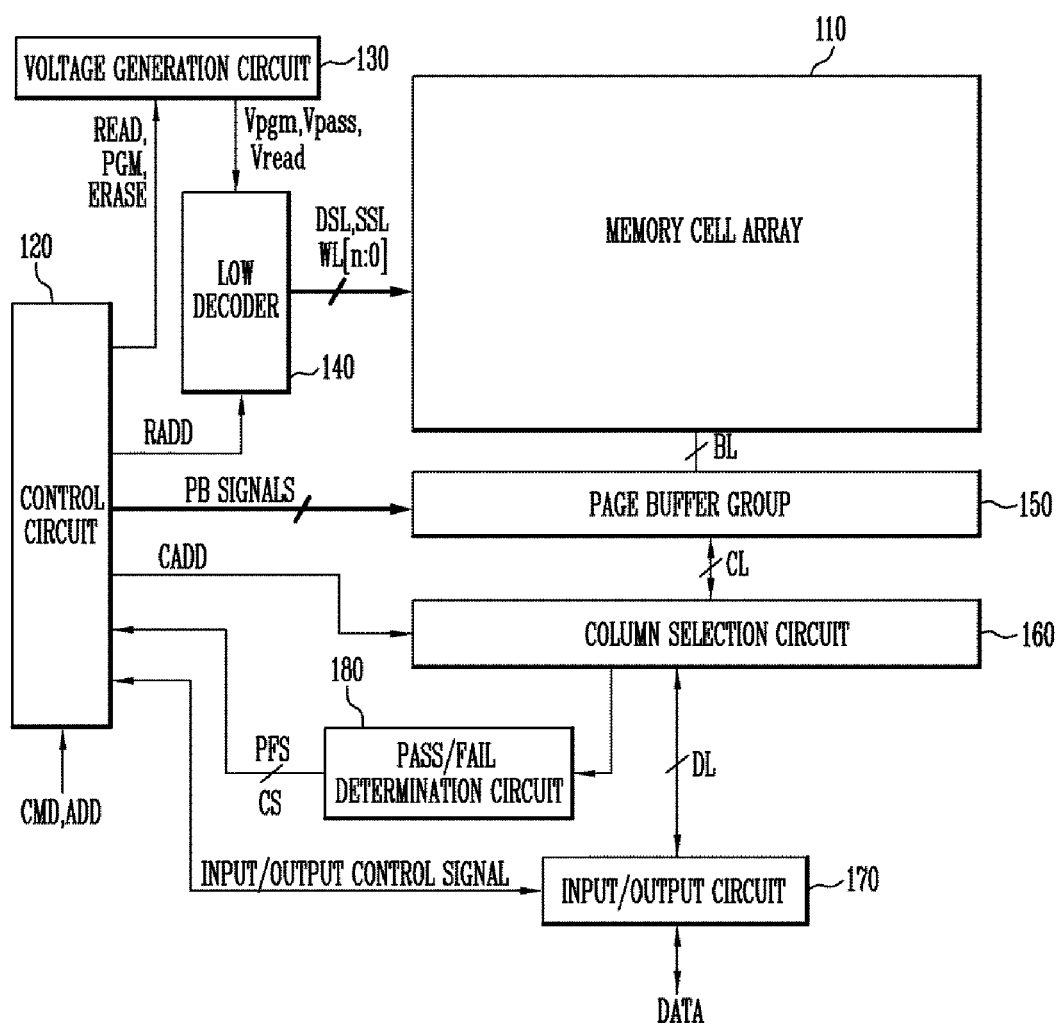
FIG. 1 is a block diagram for describing a semiconductor device according to an embodiment of the present invention.

FIG. 1 is a block diagram for describing a semiconductor device according to an embodiment of the present invention.

Referring to FIG. 1, the semiconductor device includes a memory cell array 110; programs of memory cells included in the memory cell array 110; circuit groups 130, 140, 150, 160, 170, and 180 for performing a read or erase operation; and a control circuit 120 for controlling the circuit groups 130, 140, 150, 160, 170, and 180 so as to set threshold voltage levels of the selected memory cells according to input data.

The circuit group may include a voltage generation circuit 130, a low decoder 140, a page buffer group 150, a column selection circuit 160, an input/output circuit 170, and a pass/fail determination circuit 180.

The memory cell array 110 includes a plurality of memory cell blocks, and each of the memory cell blocks includes a plurality of memory cells. The memory cell block will be described in detail with reference to FIG. 2.

The control circuit 120 internally outputs a programming operation signal (PGM), a read operation signal (READ), and an erase operation signal (ERASE) in response to a command signal (CMD), and outputs buffer signals (PB SIGNALS) for controlling page buffers included in the page buffer group 150 in accordance with types of operations. In addition, the control circuit 120 internally outputs a row address signal (RADD) and a column address signal (CADD) in response to an address signal (ADD). In addition, the control circuit 120 verifies whether threshold voltages of the memory cells selected in accordance with a check signal (CS), which is output from the pass/fail determination circuit 180 when performing a program or an erase verification operation, have reached a target voltage, and the control circuit 120 determines whether a previous operation has terminated when repeatedly performing the program or the erase operation based on the determination result.

In particular, when cells which are not erased are detected while performing the erase verification operation, the control circuit 120 controls the peripheral circuits 130, 140, 150, 160, 170, and 180 by changing a sensing reference level for determining a voltage change of bit lines so that the erase verification operation is repeatedly performed.

The voltage generation circuit 130 outputs operation voltages, for programming, reading, or erasing the memory cells, to global lines in response to the operation signals (PGM, READ, and ERASE) which are internal command signals. The voltage generation circuit 130 outputs the operation voltages (for example, Vpgm, Vpass, and Vread) to the global lines for programming when programming the memory cells.

The low decoder 140 transmits the operation voltages generated in the voltage generation circuit 130 to local lines (DSL, SSL, and WL[n:0]) of the selected memory block in response to row address signals (RADD) of the control circuit 140.

The page buffer group 150 detects a programming state or an erasing state of the memory cells.

The page buffer group 150 includes a plurality of page buffers which are connected to each of the bit lines (BL) of the memory cell array 110, and applies a voltage required for storing data to the memory cells of the memory cell array 110 in response to page buffer signals (PB SIGNALS) output from the control circuit 120. Specifically, the page buffer group 150 precharges the bit lines (BL) with respect to the memory cells when performing a program, an erase operation, or a read operation, or latches data corresponding to threshold voltage levels of the memory cells detected in accordance with a voltage change of the bit lines (BL). That is, the page buffer group 150 applies a program permission voltage (for example, 0 V) or a program inhibition voltage (for example, Vcc) to the bit lines (BLe or BLo) in accordance with the data input to the latch when performing the program, and adjusts the voltage of the bit lines (BL) in accordance with the data stored in the memory cells when performing the read operation, thereby detecting the data stored in the memory cells. In addition, the page buffer group 150 applies an erase permission voltage (for example, Vcc) to the bit lines (BL) when initially performing the erase operation, and applies a program permission voltage (for example, 0 V) to the bit lines which are connected to strings (ST) including only erased cells at the time of the program performed in accordance with an erase verification result during the erase operation. The program permission voltage is determined in accordance with the data input to the latch included in each of the page buffers based on a result of the erase verification operation. In particular, in order to distinguish between cells which are erased when performing the erase verification operation and cells which are not erased but may appear to be cells which are erased, each of the page buffers performs an erase operation, and then performs a normal erase verification operation in accordance with a first sensing reference level. When the erase operation fails based on the result of the normal erase verification operation, that is, when the cells which are not erased are detected, each of the page buffers performs an additional erase verification operation in accordance with a second sensing reference level higher than the first sensing reference level. In order to apply the second sensing reference level higher than the first sensing reference level, a level of a sensing signal applied to the page buffers is reduced below a level of a sensing signal corresponding to the first sensing reference level.

The column selection circuit 160 selects page buffers included in the page buffer group 150 in response to a column address signal (CADD) output from the control circuit 120, and outputs latched data of the selected page buffer to the selected page buffers. In addition, the column selection circuit 160 receives the data output from the page buffer group 150 through a column line (CL), and transmits the received data to the input/output circuit 170.

In order to input data (DATA) input from the outside to each of the page buffers of the page buffer group 150 when performing the program, the input/output circuit 170 transmits the data (DATA) to the column selection circuit 160 in accordance with a control of the control circuit 120. When the transmitted data is sequentially transmitted to the page buffers of the page buffer group 150 by the column selection circuit 160, the page buffers store the input data in each internal latch. In addition, when performing the read operation, the input/output circuit 170 outputs, to the outside, the data (DATA) transmitted from the page buffers of the page buffer group 150 through the column selection circuit 160.

The pass/fail determination circuit 180 outputs, a pass/fail signal (PFC), as a result of a verification operation performed after performing the program or the erase operation in accordance with the data input from the verification operation.

Figure 2:
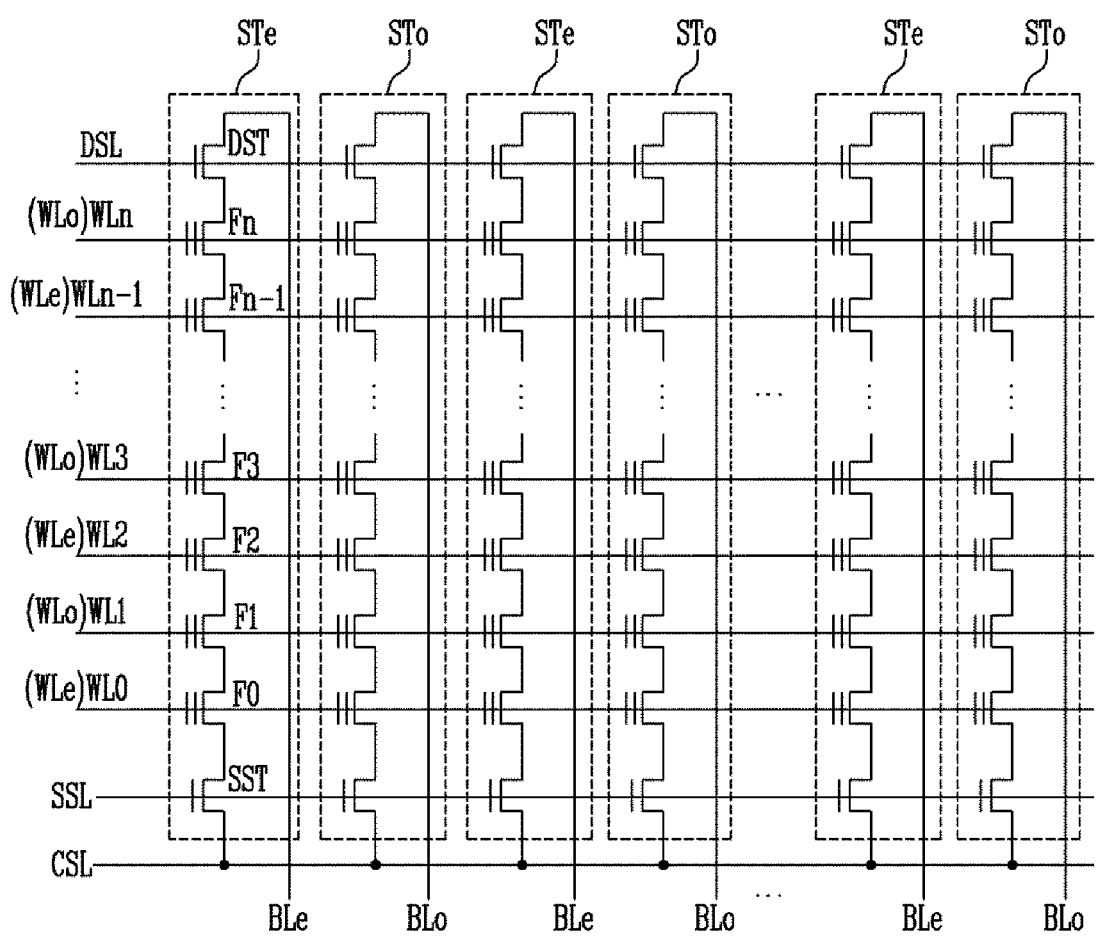
FIG. 2 is a circuit diagram for describing a part of a memory cell array of FIG. 1.

FIG. 2 is a circuit diagram for describing a part of a memory cell array of FIG. 1 in detail.

Referring to FIG. 2, any one memory cell block among a plurality of memory cell blocks included in a memory cell array is illustrated in FIG. 2, and each of the memory cell blocks has the substantially same configuration. The memory cell block includes a plurality of strings (STe and STo). Some of the strings (STe and STo) are designated as normal strings, and some are designated as flag strings. Cells included in the flag string have the substantially same configuration as that of the memory cell. In FIG. 2, the normal strings are illustrated. Even-numbered strings are referred to as even strings (STe) among the strings (STe and STo) and odd-numbered strings are referred to as odd strings (STo). The even and odd strings (STe and STo) have the substantially same configuration, and include a source selection transistor (SST) connected to a common source line (CSL), a plurality of memory cells (F0 to Fn), and a drain selection transistor (DST) connected to the even or odd bit lines (BLe or BLo). A gate of the source selection transistor (SST) is connected to a source selection line (SSL), gates of the memory cells (F0 to Fn) are connected to each of word lines (WL0 to WLn), and a gate of the drain selection transistor (DST) is connected to a drain selection line (DSL). Accordingly, the even strings (STe) are connected to each of the even bit lines (BLe), and the odd strings (STo) are connected to each of the odd bit lines (BLo). In addition, even-numbered word lines (WL0, WL2, . . . WLn) from among the word lines (WL0 to WLn) are referred to as even word lines (WLe), and odd-numbered word lines (WL1, WL3, . . . WLn-1) are referred to as odd word lines (WLo).

The page buffers connected through the bit lines (BLe and BLo) of the memory cell block will be described in detail as follows.

Figure 3:
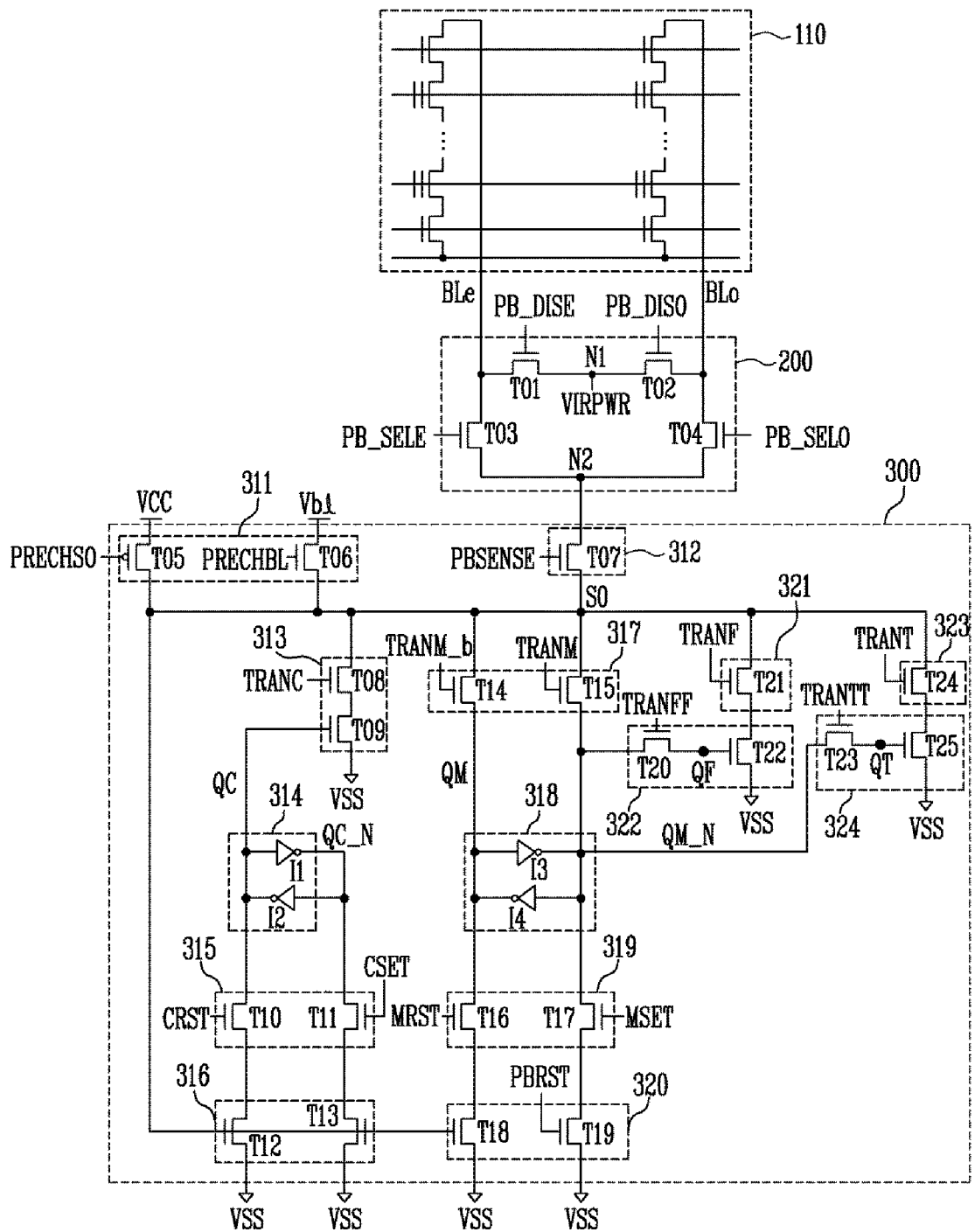
FIG. 3 is a circuit diagram for specifically describing a page buffer included in a page buffer group of FIG. 1.

FIG. 3 is a circuit diagram for describing a page buffer included in a page buffer group of FIG. 1. Each of the page buffers has the substantially same configuration, and for ease of description, only one page buffer will be described.

Referring to FIG. 3, a page buffer 300 is connected to cell strings of the memory cell array through the even bit lines (BLe) and the odd bit lines (BLo). Here, the even bit lines (BLe) denote even-numbered bit lines, and the odd bit lines (BLo) denote odd-numbered bit lines. In recent years, to improve the integration degree of the semiconductor device, a pair of bit line pairs composed of one even bit line (BLe) and one odd bit line (BLo) are connected to one page buffer, and therefore a bit line selection circuit 200 for selecting the even bit line (BLe) and the odd bit line (BLo) is provided between the memory cell array 100 and the page buffer 300.

The bit line selection circuit 200 is described as follows.

The bit line selection circuit 200 includes first and second switching elements (T01 and T02) for applying a virtual voltage (VIRPWR) to the even bit line (BLe) or the odd bit line (BLo), and third and fourth switching elements (T03 and T04) for selecting the even bit line (BLe) or the odd bit line (BLo). The first switching element (T01) connects the even bit line (BLe) and a first node (N1) to which the virtual voltage (VIRPWR) is applied in response to an even power signal (PB_DISE). The second switching element (T02) connects the odd bit line (BLo) and the first node (N1) to which the virtual voltage (VIRPWR) is applied in response to an odd power signal (PB_DISO). The third switching element (T03) connects the even bit line (BLe) and a second node (N2) in accordance with an even selection signal (PB_SELE) to thereby select the even bit line (BLe). The fourth switching element (T04) connects the odd bit line (BLo) and the second node (N2) in accordance with an odd selection signal (PB_SELO) to thereby select the odd bit line (BLo). The first to fourth switching elements (T01 to T04) may be implemented with NMOS transistors.

The page buffer 300 includes a sensing circuit 312 for connecting the even or odd bit lines (BLe or BLo) selected from the bit line selection circuit 200 and a sensing node (SO); a precharge circuit 311 for precharging the sensing node (SO); first and second latches 314 and 318 for storing program data; a first data transmission circuit 313 for transmitting data stored in the first latch 314 to the sensing node (SO); a first reset/setup circuit 315 for resetting or setting up the first latch 314; a second data transmission circuit 317 for transmitting data stored in the second latch 318 to the sensing node (SO); a second reset/setup circuit 319 for resetting or setting up the second latch 318; a sensing data transmission circuit 316 for reflecting data applied to the sensing node (SO) to the first latch 314 and the second latch 318; a page buffer reset circuit 320 for resetting the page buffer 300; a third latch 322 for storing data stored in the second latch 318; a third transmission circuit 321 for transmitting data stored in the third latch 322 to the sensing node (SO); a fourth latch 324 for storing data stored in the second latch 318; and a fourth transmission circuit 323 for transmitting data stored in the fourth latch 324 to the sensing node (SO).

The precharge circuit 311 includes a fifth switching element (T05) configured to connect a terminal to which a power voltage (VCC) is applied and the sensing node (SO) in response to a sensing node precharge signal (PRECHSO). The precharge circuit 311 may also include a sixth switching element (T06) configured to connect a terminal to which a precharge voltage (Vb1) is applied and the sensing node (SO) so as to more quickly precharge the bit lines (BLe or BLo) in accordance with a bit line precharge signal (PRECHBL). The fifth switching element (T05) is implemented with a PMOS transistor, and the sixth switching element (T06) is implemented with an NMOS transistor.

The sensing circuit 312 includes a seventh switching element (T07) configured to connect a second node (N2) and the sensing node (SO) in response to a sensing signal (PBSENSE). When the seventh switching element (T07) is turned on at the time of the precharge operation of the bit lines for the erase verification operation, the precharge voltage applied to the sensing node (SO) is transmitted to the selected bit line (BLe or BLo), and thereby the selected bit line (BLe or BLo) is precharged. In addition, when the seventh switching element (T07) is turned on, at the time of the sensing operation for the erase verification operation, a potential of the selected bit line (BLe or BLo) is transmitted to the sensing node (SO). Accordingly, a potential of the sensing node (SO) is determined in accordance with the sensing signal (PBSENSE) and the potential of the bit line (BLe or BLo), and the potential of the bit line (BLe or BLo) is determined in accordance with a state of the selected cell, and thereby the potential of the bit line (BLe or BLo) may be varied in accordance with a level of the sensing signal (PBSENSE).

The first latch 314 includes a first inverter I1 and a second inverter I2. An output terminal (QC) of the second inverter I2 is connected to an input terminal of the first inverter I1, and an output terminal (QC_N) of the first inverter I1 is connected to an input terminal of the second inverter I2.

The first data transmission circuit 313 includes an eighth switching element (T08) and a ninth switching element (T09) connected between the sensing node (SO) and a ground terminal (Vss). The ninth switching element (T09) is operated in response to the potential applied to a node (QC) of the first latch 314, and the eighth switching element (T08) is operated in response to a first transmission signal (TRANC). The eighth and ninth switching elements (T08 and T09) may be implemented with an NMOS transistor.

The first reset/setup circuit 315 includes a tenth switching element (T10) for resetting the first latch 314 in response to a first reset signal (CRST), and an eleventh switching element (T11) for setting the first latch 314 in response to a first setup signal (CSET). The tenth and eleventh switching elements (T10 and T11) may be implemented with an NMOS transistor.

The second latch 318 includes a third inverter I3 and a fourth inverter I4. An output terminal (QM) of the fourth inverter I4 is connected to an input terminal of the third inverter I3, and an output terminal (QM_N) of the third inverter I3 is connected to an input terminal of the fourth inverter I4.

The second data transmission circuit 317 includes a fifteenth switching element (T15) for mutually connecting a node (QM_N) of the second latch 318 and the sensing node (SO) in response to a second transmission signal (TRANM), and a fourteenth switching element (T14) for mutually connecting a node (QM) of the second latch 318 and the sensing node (SO) in response to an inverted second transmission signal (TRANM_b). The fourteenth and fifteenth switching elements (T14 and T15) may be implemented with an NMOS transistor.

The second reset/setup circuit 319 includes a sixteenth switching element (T16) for resetting the second latch 318 in response to a second reset signal (MRST), and a seventeenth switching element (T17) for setting up the second latch 318 in response to a second setup signal (MSET). The sixteenth and seventeenth switching elements (T16 and T17) may be implemented with an NMOS transistor.

The third latch 322 is implemented with a twentieth switching element (T20) and a twenty-second switching element (T22). The twentieth switching element (T20) stores, in a node (QF) of the third latch 322, data stored in a node (QM_N) of the second latch 318 in response to a first latch signal (TRANFF). The twenty-second switching element (T22) is turned on or turned off in accordance with the data stored in the node (QF).

The third transmission circuit 321 may be implemented with an NMOS transistor which is operated in response to a third transmission signal (TRANF); and the third transmission circuit 321 maintains a potential of the sensing node (SO) in accordance with the third transmission signal (TRANF) and the data stored in the third latch 318, or mutually connects the sensing node (SO) and the ground terminal (Vss).

The fourth latch 324 is implemented with a twenty-third switching element (T23) and a twenty-fifth switching element (T25). The twenty-third switching element (T23) stores, in a node (QT) of the fourth latch 324, data stored in a node (QM_N) of the second latch 318 in response to a second latch signal (TRANTT). The twenty-fifth switching element (T25) is turned on or off in accordance with the data stored in the node (QT).

The fourth transmission circuit 323 may be implemented with an NMOS transistor which is operated in response to the fourth transmission signal (TRANT); and the fourth transmission circuit 323 maintains a potential of the sensing node (SO) in accordance with the fourth transmission signal (TRANT) and the data stored in the fourth latch 324 or mutually connects the sensing node (SO) and the ground terminal (Vss).

The sensing data transmission circuit 316 includes a twelfth switching element (T12) for mutually connecting the tenth switching element (T10) and the ground terminal (Vcc) in response to a potential of the sensing node (SO), a thirteenth switching element (T13) for mutually connecting the eleventh switching element (T11) and the ground terminal (Vss) in response to the potential of the sensing node (SO). The twelfth and thirteenth switching elements (T12 and T13) may be implemented with NMOS transistors.

The page buffer reset circuit 320 includes an eighteenth switching element (T18) and nineteenth switching element (T19). The eighteenth switching element (T18) may mutually connect the sixteenth switching element (T16) and the ground terminal (Vss) in response to the potential of the sensing node (SO). The nineteenth switching element (T19) may mutually connect the seventeenth switching element (T17) and the ground terminal (Vss) in response to a page buffer reset signal (PBRST). The eighteenth switching element (T18) and nineteenth switching element (T19) may be implemented with NMOS transistors.

Figure 4:
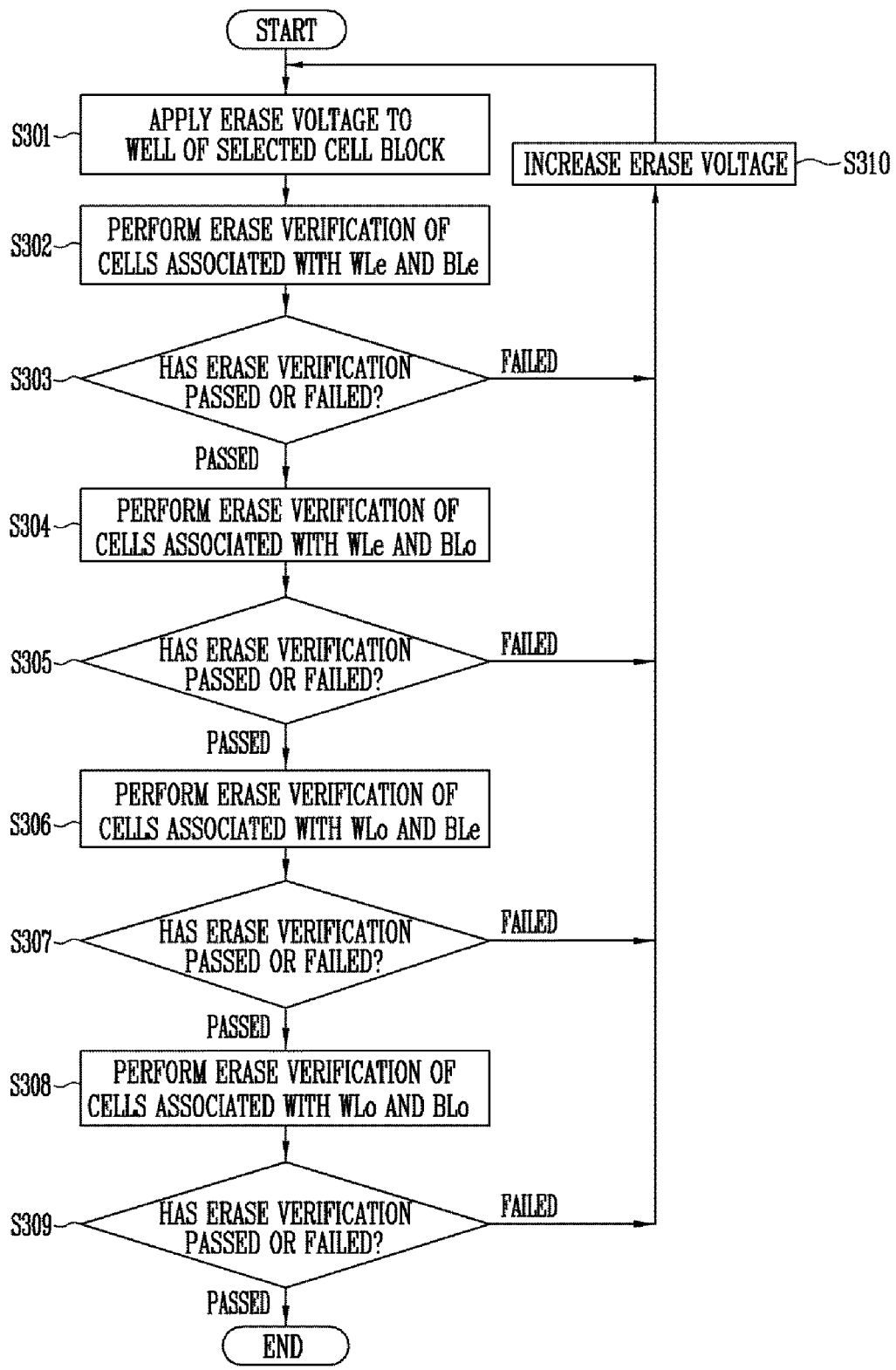
FIG. 4 is a flowchart for describing an erasing method according to a first embodiment of the present invention.

FIG. 4 is a flowchart for describing an erasing method according to a first embodiment of the present invention.

Referring to FIG. 4, in the first embodiment, an erase voltage is applied to all memory cells of selected memory cell blocks, and then an erase verification operation is performed for each memory cell group associated with even or odd word lines (WLe or WLo) and even or odd bit lines (BLe or BLo). An erase operation is performed in an incremental step pulse erase (ISPE) scheme which gradually increases an erase voltage until threshold voltages of the all memory cells of the selected memory cell block are reduced to a target level or less. When the erase verification is performed on each of cells associated with the even or odd word lines and even or odd bit lines, back pattern dependency may be reduced compared to when the erase verification is simultaneously performed on all of the cells. Here, the memory cells associated with the even word lines (WLo) and the even bit lines (BLe) may denote memory cells connected to the even word lines of the memory cells of even cell strings connected to the even bit lines (BLe) among a plurality of cell strings included in the selected memory cell block. Accordingly, the memory cell associated with the even word lines (WLe) and the odd bit lines (BLo) denotes a memory cell connected to the even word lines among the memory cells of odd cell strings, the memory cell associated with the odd word lines (WLo) and the even bit lines (BLe) denotes a memory cell connected to the odd word lines among the memory cells of even cell strings, and the memory cell associated with the odd word lines (WLo) and the odd bit lines (BLo) denotes a memory cell connected to the odd word lines among the memory cells of the odd cell strings.

An erasing method according to the first embodiment will be described in detail as follows.

Application of Erase Voltage (Σ301)

When an erase operation starts, a positive erase voltage is applied to a well of a selected memory cell block, and a ground voltage is applied to all word lines (WLe and WLo), thereby reducing threshold voltages of the memory cells included in the selected memory cell block. In this example, to increase efficiency of the erase operation, a positive voltage may be applied to the even and odd bit lines (BLe and BLo).

First Erase Verification (Σ302)

An erase verification operation is performed on cells associated with the even word lines (WLe) and the even bit lines (BLe) in accordance with a first sensing reference level. Specifically, the even bit lines (BLe) are precharged, and then an erase verification operation with respect to cells associated with the even word lines (WLe) and the even bit lines (BLe) is performed by applying a verification voltage (for example, 0 V) to the even word lines (WLe) and applying a verification pass voltage (positive voltage) to the odd word lines (WLo).

First Pass/Fail Determination (Σ303)

When potentials of all precharged even bit lines (BLe) are reduced to a first sensing reference level or less, as determined at step S303 based on a result of an erase verification operation of step S302, the erase verification operation passes; but when a potential of at least one even bit line (BLe) is not reduced to the first sensing reference level or less, that is, when cells which are not erased are detected, the erase operation in the erase verification operation is determined to have failed. In this manner, when the cells which are not erased are detected, step S310 is performed to increase an erase voltage, and an erase operation of the selected cell block may be repeatedly performed by applying the increased erase voltage to a well of the selected cell block in step S301 and performing the steps of the method which follow step S301.

Second Erase Verification (Σ304)

In step S303, when an erase verification operation with respect to the memory cells associated with the even word lines (WLe) and the even bit lines (BLe) passes, an erase verification operation with respect to cells associated with the even word lines (WLe) and the odd bit lines (BLo) is performed in accordance with a first sensing reference level. Specifically, the odd bit lines (BLo) are precharged, and then an erase verification operation with respect to cells associated with the even word lines (WLe) and the odd bit lines (BLo) is performed by applying a verification voltage (for example, 0 V) to the even word lines (WLe) and applying a verification pass voltage (positive voltage) to the odd word lines (WLo).

Second Pass/Fail Determination (Σ305)

When potentials of all precharged odd bit lines (BLo) are reduced to the first sensing reference level or less as determined at step S305 based on a result of an erase verification operation of step S304, the erase verification operation passes, but when a potential of at least one odd bit line (BLo) is not reduced to the first sensing reference level or less, the erase operation in the erase verification operation is determined to have failed. When the erase operation fails, step S310 is performed to increase an erase voltage, and an erase operation of the selected cell block is repeatedly performed by applying the increased erase voltage to a well of the selected cell block in step S301 and performing the steps of the method which follow step S301.

Third Erase Verification (Σ306)

In step S305, when an erase verification operation with respect to the memory cells associated with the even word lines (WLe) and the odd bit lines (BLo) passes, an erase verification operation with respect to cells associated with the odd word lines (WLo) and the even bit lines (BLe) is performed in accordance with a first sensing reference level. Specifically, the even bit lines (BLe) are precharged, and then an erase verification operation with respect to cells associated with the odd word lines (WLo) and the even bit lines (BLe) is performed by applying a verification voltage (for example, 0 V) to the odd word lines (WLo) and applying a verification pass voltage (positive voltage) to the even word lines (WLe).

Third Pass/Fail Determination (Σ307)

When potentials of all precharged even bit lines (BLe) are reduced to the first sensing reference level or less as determined at step S307 based on a result of an erase verification operation of step S306, the erase verification operation passes, but when a potential of at least one even bit line (BLe) is not reduced to the first sensing reference level or less, the erase operation in the erase verification operation is determined to have failed. When the erase operation fails, step S310 is performed to increase an erase voltage, and an erase operation of the selected cell block is repeatedly performed by applying the increased erase voltage to a well of the selected cell block in step S301 and performing the steps of the method which follow step S301.

Fourth Erase Verification (Σ308)

In step S307, when an erase verification operation with respect to the memory cells associated with the odd word lines (WLo) and the even bit lines (BLe) passes, an erase verification operation with respect to cells associated with the odd word lines (WLo) and the odd bit lines (BLo) is performed in accordance with a first sensing reference level. Specifically, the odd bit lines (BLo) are precharged, and then an erase verification operation with respect to cells associated with the odd word lines (WLo) and the odd bit lines (BLo) is performed by applying a verification voltage (for example, 0 V) to the odd word lines (WLo) and applying a verification pass voltage (positive voltage) to the even word lines (WLe).

Fourth Pass/Fail Determination (Σ309)

When potentials of all precharged even bit lines (BLe) are reduced to the first sensing reference level or less as determined at step S309 based on a result of an erase verification operation of step S308, the erase verification operation passes, but when a potential of at least one even bit line (BLe) is not reduced to the first sensing reference level or less, the erase operation in the erase verification operation is determined to have failed. When the erase operation fails, step S310 is performed to increase an erase voltage, and an erase operation of the selected cell block is repeatedly performed by applying the increased erase voltage to a well of the selected cell block in step S301 and performing the steps of the method which follow step S301.

When the fourth pass/fail determination S309 is passed, the erase verification operation with respect to all memory cells of the selected memory cell block is passed, and therefore the erase operation with respect to the selected memory cell block is terminated.

Figure 5:
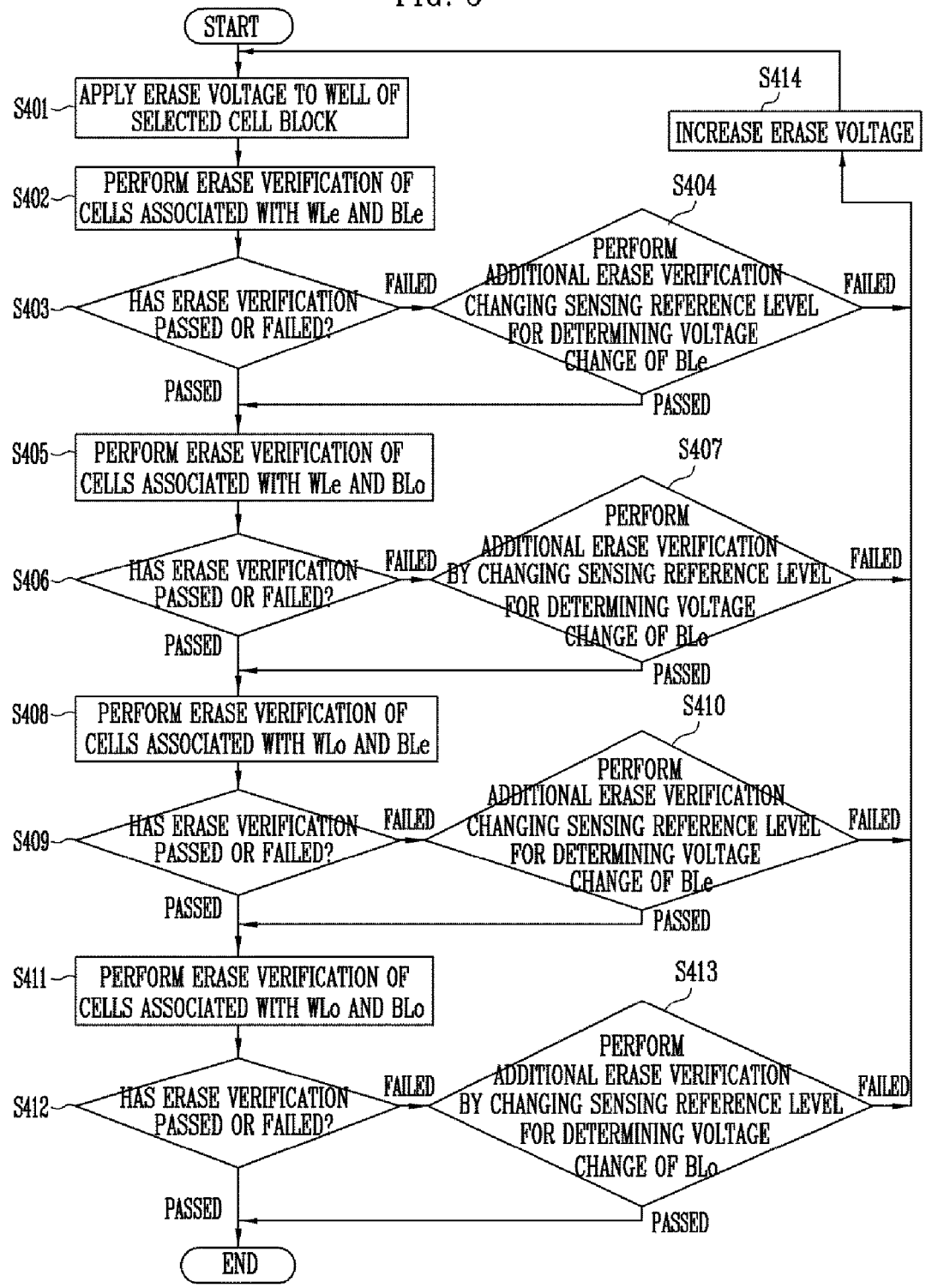
FIG. 5 is a flowchart for describing an erasing method according to a second embodiment of the present invention.

FIG. 5 is a flowchart for describing an erasing method according to a second embodiment of the present invention.

Referring to FIG. 5, in the substantially same manner as that in the first embodiment, an erase voltage is applied to all memory cells of selected memory cell blocks, and then an erase verification operation is performed for each memory cell group associated with even or odd word lines (WLe or WLo) and even or odd bit lines (BLe or BLo). Here, when an erase operation in each of the erase verification operations is determined to have failed, an additional erase verification operation is performed by increasing a sensing reference level of the erase verification operation. Therefore, it is possible to reduce back pattern dependency compared to when the erase verification is simultaneously performed on all of the cells, and to suppress an increase in stress caused by excessive erasing by increasing the sensing reference level of the verification operation. An erase operation is performed in an incremental step pulse erase (ISPE) scheme which gradually increases an erase voltage until threshold voltages of all of the memory cells of the selected memory cell block are reduced to a target level or less. Here, the memory cells associated with the even word lines (WLo) and the even bit lines (BLe) may denote memory cells connected to the even word lines of the memory cells of even cell strings connected to the even bit lines (BLe) among a plurality of cell strings included in the selected memory cell block. Accordingly, the memory cell associated with the even word lines (WLe) and the odd bit lines (BLo) denotes a memory cell connected to the even word lines among the memory cells of odd cell strings, the memory cell associated with the odd word lines (WLo) and the even bit lines (BLe) denotes a memory cell connected to the odd word lines among the memory cells of even cell strings, and the memory cell associated with the odd word lines (WLo) and the odd bit lines (BLo) denotes a memory cell connected to the odd word lines among the memory cells of the odd cell strings.

An erasing method according to the second embodiment will be described in detail as follows.
Application of Erase Voltage (Σ401)

When an erase operation starts, a positive erase voltage is applied to a well of a selected memory cell block, and a ground voltage is applied to all word lines (WLe and WLo), thereby reducing threshold voltages of the memory cells included in the selected memory cell block. In this instance, to increase efficiency of the erase operation, a positive voltage may be applied to the even and odd bit lines (BLe and BLo).
First Erase Verification (Σ402)

An erase verification operation is performed on cells associated with the even word lines (WLe) and the even bit lines (BLe) in accordance with a first sensing reference level. Specifically, the first sensing reference level is determined in accordance with the sensing signal (PBSENSE) of FIG. 3. A level of the sensing signal (PBSENSE) and the sensing reference level in the erase verification operation are proportional to each other. Accordingly, the first sensing reference level is determined as an optimized level based on a plurality of test results, and for this, the level of the sensing signal (PBSENSE) is also optimized and determined.

To perform the erase verification operation, the even bit lines (BLe) are precharged, and then an erase verification operation with respect to cells associated with the even word lines (WLe) and the even bit lines (BLe) is performed by applying a verification voltage (for example, 0 V) to the even word lines (WLe) and applying a verification pass voltage (positive voltage) to the odd word lines (WLo).
First Pass/Fail Determination (Σ403)

When potentials of all precharged even bit lines (BLe) are reduced to a first sensing reference level or less as determined at step S403 based on a result of an erase verification operation of step S402, the erase verification operation passes, but when a potential of at least one even bit line (BLe) is not reduced to the first sensing reference level or less, cells which are not erased are detected, and therefore the erase operation fails.
First Additional Erase Verification (Σ404)

In step S403, when the cells which are not erased are detected, the even bit lines (BLe) are all precharged to perform an additional erase verification operation, and then an erase verification operation with respect to cells associated with the even word lines (WLe) and the even bit lines (BLe) is performed in accordance with a second sensing reference level higher than the first sensing reference level by applying a verification voltage (for example, 0 V) to the even word lines (WLe) and applying a verification pass voltage (positive voltage) to the odd word lines (WLo). Next, whether the erase operation has passed or failed is determined. That is, in step S403, when the erase operation is determined to have failed, the erase verification operation is additionally performed in accordance with the second sensing reference level higher than the first sensing reference level by applying an offset to the first sensing reference level of step S402. To increase the first sensing reference level to the second sensing reference level, a level of the sensing signal (PBSENSE) applied to the page buffers should be reduced.

The first sensing reference level is increased to the second sensing reference level to prevent an error occurring in which a junction of a lower portion of a memory cell is deteriorated when the program of the semiconductor device and the erase operation are repeatedly performed, a current (Itrip current) flowing in a cell string selected at the time of the erase verification operation is recognized as small due to the deterioration of the junction, and thereby a substantially erased cell is erroneously recognized as a programmed cell. Accordingly, when the sensing reference level is increased at the time of the erase verification operation, cells which are erroneously recognized as programmed cells may be correctly recognized as erased cells. Therefore, it is preferable that the second sensing reference level be determined in accordance with results obtained by testing a degree of electrical deterioration of the junction due to an increase in a cycling frequency of the semiconductor device, and the determined value is fixed and used. That is, each of the first sensing reference level and the second sensing reference level has a fixed level value.

When potentials of all precharged even bit lines (BLe) are reduced to the second sensing reference level or less, as determined based on a result of an additional erase verification operation in step S404, the additional erase verification operation passes; but when a potential of at least one even bit line (BLe) is not reduced to the second sensing reference level or less, the erase operation in the additional erase verification operation is determined to have failed.

When the erase operation in the additional erase verification operation is determined to have failed, step S414 is performed to increase an erase voltage, and an erase operation of the selected cell block is repeatedly performed by applying the increased erase voltage to a well of the selected cell block in step S401 and performing the steps of the method which follow step S401.

Second Erase Verification (Σ405)

When an erase verification operation of steps S403 and S404 passes, an erase verification operation with respect to cells associated with the even word lines (WLe) and the odd bit lines (BLo) is performed in accordance with the first sensing reference level. Specifically, the odd bit lines (BLo) are precharged, and then an erase verification operation with respect to cells associated with the even word lines (WLe) and the odd bit lines (BLo) is performed by applying a verification voltage (for example, 0 V) to the even word lines (WLe) and applying a verification pass voltage (positive voltage) to the odd word lines (WLo).

Second Pass/Fail Determination (Σ406)

When potentials of all precharged odd bit lines (BLo) are reduced to the first sensing reference level or less as determined based on a result of an erase verification operation of step S405, the erase verification operation passes, but when a potential of at least one odd bit line (BLo) is not reduced to the first sensing reference level or less, the erase operation in the erase verification operation is determined to have failed.

Second Additional Erase Verification (Σ407)

In step S406, when the erase operation fails, the odd bit lines (BLo) are all precharged to perform an additional erase verification operation, and then an erase verification operation with respect to cells associated with the even word lines (WLe) and the odd bit lines (BLo) is performed in accordance with a second sensing reference level higher than the first sensing reference level by applying a verification voltage (for example, 0 V) to the even word lines (WLe) and applying a verification pass voltage (positive voltage) to the odd word lines (WLo). Next, whether the erase operation has passed or failed is determined. That is, in step S406, when the erase operation fails, the erase verification operation is additionally performed in accordance with the second sensing reference level higher than the first sensing reference level by applying offset to the first sensing reference level.

When potentials of all precharged odd bit lines (BLo) are reduced to the second sensing reference level or less as determined based on a result of an additional erase verification operation in step S407, the additional erase verification operation passes, but when a potential of at least one odd bit line (BLo) is not reduced to the second sensing reference level or less, the erase operation in the additional erase verification operation is determined to have failed.

When the erase operation in the additional erase verification operation is determined to have failed, step S414 is performed to increase an erase voltage, and an erase operation of the selected cell block is repeatedly performed by applying the increased erase voltage to a well of the selected cell block S401 and performing the steps of the method which follow step S401.

Third Erase Verification (Σ408)

When an erase verification operation of steps S406 and S407 passes, an erase verification operation with respect to cells associated with the odd word lines (WLo) and the even bit lines (BLe) is performed in accordance with a first sensing reference level. Specifically, the even bit lines (BLe) are precharged, and then an erase verification operation with respect to cells associated with the odd word lines (WLo) and the even bit lines (BLe) is performed by applying a verification voltage (for example, 0 V) to the odd word lines (WLo) and applying a verification pass voltage (positive voltage) to the even word lines (WLe).

Third Pass/Fail Determination (Σ409)

When potentials of all precharged even bit lines (BLe) are reduced to the first sensing reference level or less as determined at step S409 based on a result of an erase verification operation of step S408, the erase verification operation passes, but when a potential of at least one even bit line (BLe) is not reduced to the first sensing reference level or less, the erase operation in the erase verification operation is determined to have failed.

Third Additional Erase Verification (Σ410)

In step S409, when the erase operation fails, the even bit lines (BLe) are all precharged to perform an additional erase verification operation, and then an erase verification operation with respect to cells associated with the odd word lines (WLo) and the even bit lines (BLe) is performed in accordance with a second sensing reference level higher than the first sensing reference level by applying a verification voltage (for example, 0 V) to the odd word lines (WLo) and applying a verification pass voltage (positive voltage) to the even word lines (WLe). Next, whether the erase operation in the erase verification operation has passed or failed is determined. That is, in step S409, when the erase operation is determined to have failed, the erase verification operation is additionally performed in accordance with the second sensing reference level higher than the first sensing reference level by applying offset to the first sensing reference level.

When potentials of all precharged even bit lines (BLe) are reduced to the second sensing reference level or less as determined based on a result of an additional erase verification operation in step S410, the additional erase verification operation passes, but when a potential of at least one even bit line (BLe) is not reduced to the second sensing reference level or less, the erase operation in the additional erase verification operation is determined to have failed.

When the erase operation in the additional erase verification operation is determined to have failed, step S414 is performed to increase an erase voltage, and an erase operation of the selected cell block is repeatedly performed by applying the increased erase voltage to a well of the selected cell block in step S401 and performing the steps of the method which follow step S401.

Fourth Erase Verification (Σ411)

When an erase verification operation of steps S409 and S410 passes, an erase verification operation with respect to cells associated with the odd word lines (WLo) and the odd bit lines (BLo) is performed in accordance with a first sensing reference level. Specifically, the odd bit lines (BLo) are precharged, and then an erase verification operation with respect to cells associated with the odd word lines (WLo) and the odd bit lines (BLo) is performed by applying a verification voltage (for example, 0 V) to the odd word lines (WLo) and applying a verification pass voltage (positive voltage) to the even word lines (WLe).

Fourth Pass/Fail Determination (Σ412)

When potentials of all precharged odd bit lines (BLo) are reduced to the first sensing reference level or less as determined at step S412 based on a result of an erase verification operation of step S411, the erase verification operation passes, but when a potential of at least one odd bit line (BLo) is not reduced to the first sensing reference level or less, the erase operation in the erase verification operation is determined to have failed.

Fourth Additional Erase Verification (Σ413)

In step S412, when the erase operation is determined to have failed, the odd bit lines (BLo) are all precharged to perform an additional erase verification operation, and then an erase verification operation with respect to cells associated with the odd word lines (WLo) and the odd bit lines (BLo) is performed in accordance with a second sensing reference level higher than the first sensing reference level by applying a verification voltage (for example, 0 V) to the odd word lines (WLo) and applying a verification pass voltage (positive voltage) to the even word lines (WLe). Next, whether the erase operation has passed or failed is determined. That is, in step S412, when the erase operation is determined to have failed, the erase verification operation is additionally performed in accordance with the second sensing reference level higher than the first sensing reference level by applying an offset to the first sensing reference level.

When potentials of all precharged odd bit lines (BLo) are reduced to the second sensing reference level or less as determined based on a result of an additional erase verification operation in step S413, the additional erase verification operation passes, but when a potential of at least one odd bit line (BLo) is not reduced to the second sensing reference level or less, the erase operation in the additional erase verification operation is determined to have failed.

When the erase operation in the additional erase verification operation is determined to have failed, step S414 is performed to increase an erase voltage, and an erase operation of the selected cell block is repeatedly performed by applying the increased erase voltage to a well of the selected cell block in step S401 and performing the steps of the method which follow step S401.

When the fourth pass/fail determination step S412 or the fourth additional erase verification step S413 passes, the erase verification operation with respect to all memory cells of the selected memory cell block passes, and therefore the erase operation with respect to the selected memory cell block is terminated.

Figure 6:
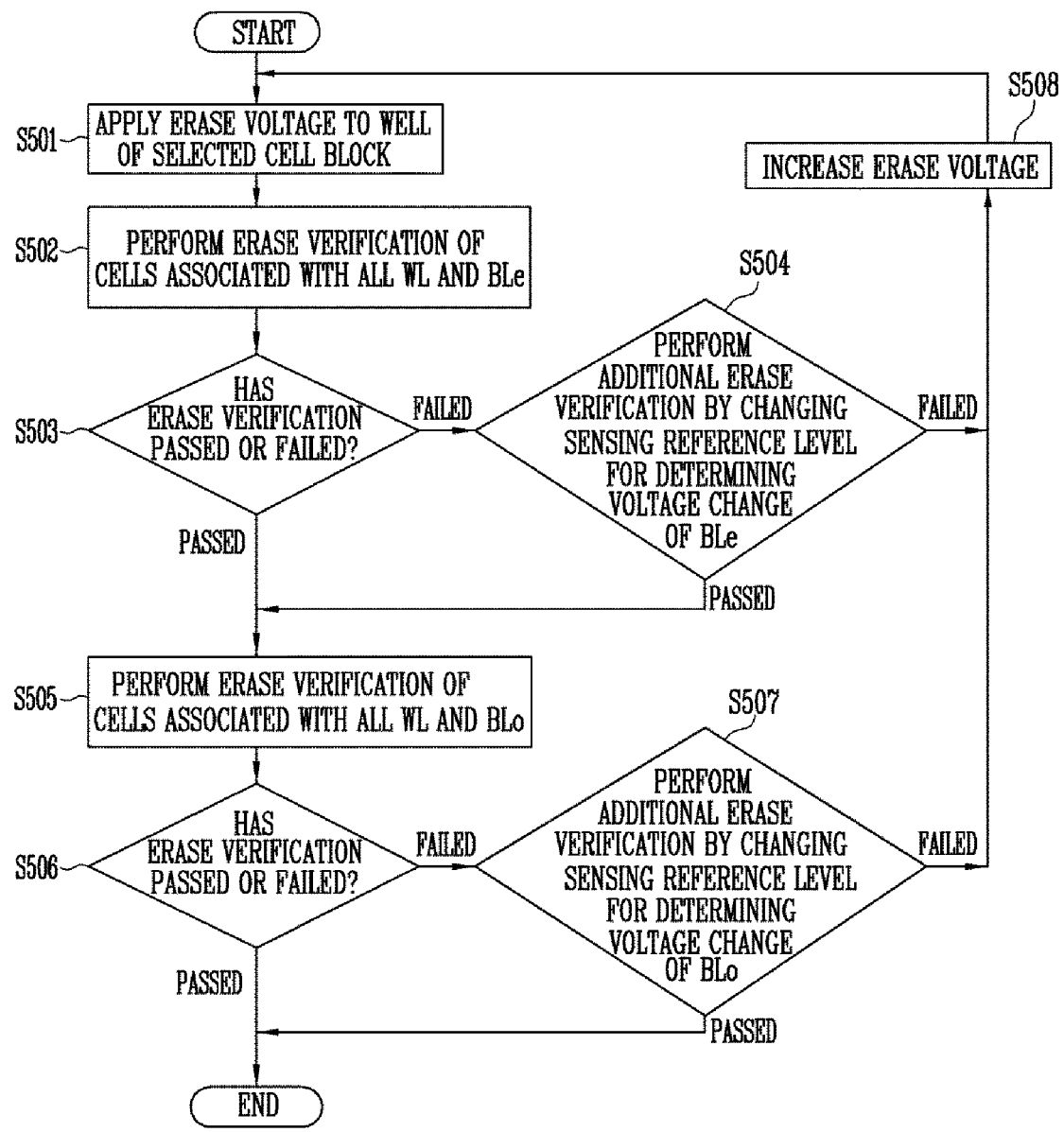
FIG. 6 is a flowchart for describing an erasing method according to a third embodiment of the present invention.

FIG. 6 is a flowchart for describing an erasing method according to a third embodiment of the present invention.

Referring to FIG. 6, in the substantially same manner as that in the second embodiment, an erase voltage is applied to all memory cells of selected memory cell blocks, an erase verification operation of the selected memory cells is performed, and the memory cells of the selected memory cell block are classified into only cells associated with the even bit lines (BLe) and the odd bit lines (BLo) while an additional erase verification operation is performed by increasing a sensing reference level when an erase operation is determined to have failed based on a result of the erase verification operation, thereby reducing a time of the erase verification operation. That is, in the third embodiment, the erase verification operation is performed with respect to all memory cells of even cell strings connected to the even bit lines (BLe), and the erase verification operation is performed with respect to all memory cells of odd cell strings connected to the odd bit lines (BLo).

An erasing method according to the third embodiment will be described in detail as follows.

Application of Erase Voltage (Σ501)

When an erase operation starts, a positive erase voltage is applied to a well of a selected memory cell block, and a ground voltage is applied to all word lines (WLe and WLo), thereby reducing threshold voltages of the memory cells included in the selected memory cell block. In this instance, to increase efficiency of the erase operation, a positive voltage may be applied to the even and odd bit lines (BLe and BLo).

First Erase Verification (Σ502)

An erase verification operation is performed with respect to all cells associated with the even bit lines (BLe) in accordance with a first sensing reference level. Specifically, the first sensing reference level is determined in accordance with the sensing signal (PBSENSE) of FIG. 3, and a level of the sensing signal (PBSENSE) and the sensing reference level in the erase verification operation are proportional to each other. Accordingly, the first sensing reference level is determined as an optimized level based on a plurality of test results, and for this, the level of the sensing signal (PBSENSE) is also optimized and determined.

To perform the erase verification operation, the even bit lines (BLe) are precharged, and then an erase verification operation with respect to cells associated with the even bit lines (BLe) is performed by applying a verification voltage (for example, 0 V) to all of the word lines (WL).

First Pass/Fail Determination (Σ503)

When potentials of all precharged even bit lines (BLe) are reduced to a first sensing reference level or less as shown by a result of an erase verification operation of step S502, the erase verification operation passes, but when a potential of at least one even bit line (BLe) is not reduced to the first sensing reference level or less, the erase operation in the erase verification operation is determined to have failed.

First Additional Erase Verification (Σ504)

In step S503, when the erase operation fails, the even bit lines (BLe) are all precharged to perform an additional erase verification operation, and then an erase verification operation with respect to all cells associated with the even bit lines (BLe) is performed in accordance with a second sensing reference level higher than the first sensing reference level by applying a verification voltage (for example, 0 V) to all of the word lines (WL). Next, whether the erase operation in the erase verification operation has passed or failed is determined. That is, in step S503, when the erase operation fails, the erase verification operation is additionally performed in accordance with the second sensing reference level higher than the first sensing reference level by applying offset to the first sensing reference level of step S502. To increase the first sensing reference level to the second sensing reference level, a level of the sensing signal (PBSENSE) applied to the page buffers should be reduced.

The first sensing reference level is increased to the second sensing reference level to prevent an error occurring in such a way that a junction of a lower portion of a memory cell is deteriorated when the program of the semiconductor device and the erase operation are repeatedly performed, a current (Itrip current) flowing in a cell string selected at the time of the erase verification operation is recognized as small due to the deterioration of the junction, and thereby a substantially erased cell is erroneously recognized as a programmed cell. Therefore, it is preferable that the second sensing reference level be determined in accordance with results obtained by testing a degree of deterioration of the junction due to an increase in a cycling frequency of the semiconductor device, and the determined value be fixed and used. That is, each of the first sensing reference level and the second sensing reference level may have a fixed level value.

When potentials of all precharged even bit lines (BLe) are reduced to the second sensing reference level or less as determined based on a result of an additional erase verification operation in step S504, the additional erase verification operation passes, but when a potential of at least one even bit line (BLe) is not reduced to the second sensing reference level or less, the erase operation in the additional erase verification operation is determined to have failed.

When the erase operation in the additional erase verification operation is determined to have failed, step S508 is performed to increase an erase voltage, and an erase operation of the selected cell block is repeatedly performed by applying the increased erase voltage to a well of the selected cell block in step S501 and performing the steps of the method that follow step S01.

Second Erase Verification (Σ505)

When an erase verification operation of steps S503 and S504 passed, an erase verification operation with respect to cells associated with the odd bit lines (BLo) is performed in accordance with the first sensing reference level. Specifically, the odd bit lines (BLo) are precharged, and then an erase verification operation with respect to all memory cells associated with the odd bit lines (BLo) is performed by applying a verification voltage (for example, 0 V) to all word lines (WL).

Second Pass/Fail Determination (Σ506)

When potentials of all precharged odd bit lines (BLo) are reduced to the first sensing reference level or less as determined at step S506 based on a result of an erase verification operation of step S505, the erase verification operation passes, but when a potential of at least one odd bit line (BLo) is not reduced to the first sensing reference level or less, the erase operation in the erase verification operation is determined to have failed.

Second Additional Erase Verification (Σ507)

In step S506, when the erase operation fails, the odd bit lines (BLo) are all precharged to perform an additional erase verification operation, and then an erase verification operation with respect to all cells associated with the odd bit lines (BLo) is performed in accordance with a second sensing reference level higher than the first sensing reference level by applying a verification voltage (for example, 0 V) to all word lines (WL). Next, whether the erase operation has passed or failed is determined. That is, in step S506, when the erase operation fails, the erase verification operation is additionally performed in accordance with the second sensing reference level higher than the first sensing reference level by applying offset to the first sensing reference level.

When potentials of all precharged odd bit lines (BLo) are reduced to the second sensing reference level or less based on a result of an additional erase verification operation in step S507, the additional erase verification operation passes, but when a potential of at least one odd bit line (BLo) is not reduced to the second sensing reference level or less, the erase operation in the additional erase verification operation is determined to have failed.

When the erase operation in the additional erase verification operation is determined to have failed, step S508 is performed to increase an erase voltage, and an erase operation of the selected cell block is repeatedly performed by applying the increased erase voltage to a well of the selected cell block in step S501.

When the second pass/fail determination step S506 or the second additional erase verification step S507 passes, the erase verification operation with respect to all memory cells of the selected memory cell block passes, and therefore the erase operation with respect to the selected memory cell block is terminated.

Figure 7:
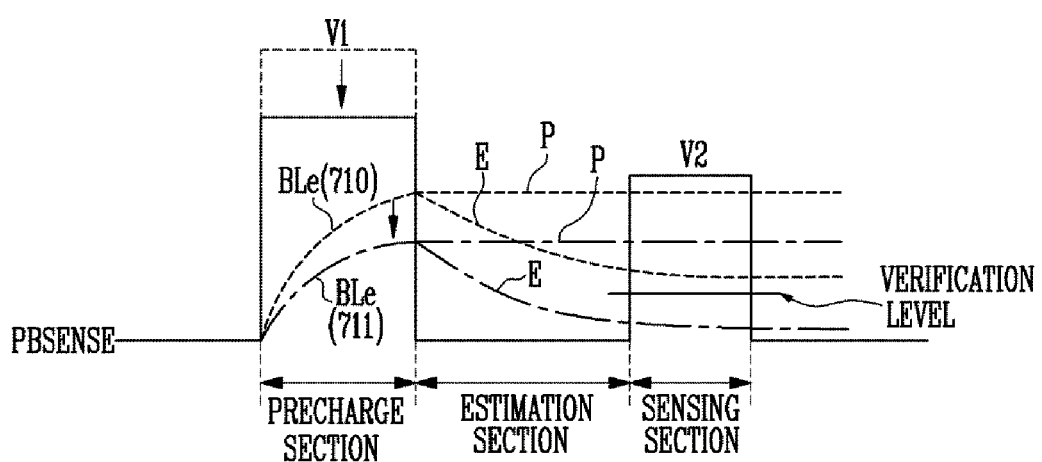
FIG. 7 is a timing diagram for describing a method for driving a page buffer according to an erasing method of the present invention.

FIG. 7 is a timing diagram for describing a method for driving a page buffer according to an erasing method of the present invention.

Referring to FIG. 7, a sensing reference level of an erase verification operation may be adjusted by controlling a sensing signal (PBSENSE) applied to a page buffer at the time of erase verification operation. When the erase verification operation starts, a sensing signal (PBSENSE) of a first voltage (V1) is applied to a seventh switching element (T07 of FIG. 3) in order to precharge selected bit lines in a precharge section.

This will be described in detail with reference to the page buffer of FIG. 3.

To precharge the bit lines, the sensing node (SO) is precharged by applying a high bit line precharge signal (PRECHBL) to the sixth switching element (T06) of the page buffer 300. Next, when the sensing signal (PBSENSE) of the first voltage is applied to the seventh switching element (T07) in the precharge section, and a high even or odd selection signal (PB_SELE or PB_SELO) is applied to the third or fourth switching element (T03 or T04), the selected bit line and the precharged sensing node (SO) are connected to each other, and therefore the selected bit line is precharged.

A case in which the selected bit line is the even bit line (BLe) and the sensing voltage (PBSENSE) is the first voltage (V1) corresponding to the first sensing reference level will be described as follows. The even bit lines 710 (BLe) is precharged up to a first precharge level in accordance with the first voltage (V1) during the precharge section. A state of the selected memory cells is reflected in the even bit lines (BLe) during an estimation section. In this instance, the first precharge level is maintained in the even bit lines (P of 710) associated with programmed cells, and the first precharge level is reduced in the even bit lines (E of 710) associated with erased cells. Subsequently, when the sensing signal (PBSENSE) is applied as a second voltage (V2) lower than the first voltage (V1) during a sensing section, a state of a corresponding memory cell is determined in accordance with a verification level. For example, when potentials of corresponding bit lines are lower than the verification level, the selected cells may be determined as erased cells. However, cells which are erased but are sensed with a level higher than the verification level in the sensing section may be erroneously determined as programmed cells.

In the above-described example, an effect in which a sensing reference level of an erase verification operation is increased by reducing the level of the sensing signal (PBSENSE) is obtained in the precharge section, but an effect in which the sensing reference level is increased by increasing the level of the sensing signal (PBSENSE) to be higher than the second voltage (V2) in the sensing section may be obtained, and therefore the sensing reference level may be increased by adjusting the level of the sensing signal (PBSENSE) in a variety of methods at the time of erase verification operation, rather than the above-described method.

As described above, reliability of the semiconductor device in which electrical characteristics deteriorate due to an increase in a cycling frequency may be improved by increasing the sensing reference level of the erase verification operation. In addition, it is possible to prevent the erase operation from being excessively repeated, and therefore an erase operation time may be reduced, and stress of the semiconductor device may be reduced.

According to embodiments of the present invention, by performing the additional erase verification operation in which the sensing reference level of the verification operation is increased when the normal erase verification operation fails at the time of the erase operation, reliability of the semiconductor device in which cells erroneously recognized as cells which are completely erased or cells which are not erased can be recognized as erased cells may be improved, and stress of the semiconductor device may be reduced by reducing an erase operation frequency.

In the drawings and specification may include typical example embodiments of the invention and, although specific terms are employed, these terms are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device comprising:
   peripheral circuits configured to apply an erase voltage to memory cells when performing an erase operation, and sense a voltage change of bit lines by an erase verification voltage applied to word lines of the memory cells when performing an erase verification operation to thereby detect cells which are not erased; and
   a control circuit configured to control the peripheral circuits by changing a sensing reference level for determining the voltage change of the bit lines when the cells which are not erased are detected when performing the erase verification operation, so that the erase verification operation is repeatedly performed, wherein the sensing reference level is changed by changing a level of a sensing signal applied to a switching element for connecting a sensing node of a page buffer and a selected bit line.

2. The semiconductor device of claim 1, wherein the control circuit increases the sensing reference level when the erase verification operation is repeatedly performed.

3. The semiconductor device of claim 1, wherein, when cells which are not erased are detected, the control circuit reduces the level of the sensing signal below a level of a sensing signal used when performing the erase verification operation to thereby reduce a precharge level of the bit lines, as part of repeatedly performing the erase verification operation.

4. An operating method of a semiconductor device, comprising:
   applying an erase voltage to memory cells;
   performing a first erase verification operation for applying an erase verification voltage to word lines of the memory cells and sensing a voltage change of bit lines by the erase verification voltage on the basis of a first sensing reference level to thereby detect cells which are not erased from among first memory cells associated with the bit lines;
   performing an additional first erase verification operation for changing the first sensing reference level to a second sensing reference level when cells which are not erased are detected from among the first memory cells;
   repeatedly performing an erase operation for erasing the memory cells when cells which are not erased are detected when performing the first additional erase verification operation;
   performing a second erase verification operation for applying the erase verification voltage to the word lines and sensing a voltage change of odd bit lines by the erase verification voltage on the basis of the first sensing reference level to thereby detect cells which are not erased, from among second memory cells associated with the odd bit lines, when all the first memory cells are erased;
   performing an additional second erase verification operation on the basis of the second sensing reference level, when cells which are not erased are detected from among the second memory cells;
   repeatedly performing the erase operation when cells which are not erased are detected when performing the additional second erase verification operation; and
   terminating the erase operation when all the second memory cells are erased,
   wherein the additional first and second erase verification operations are performed by increasing the first sensing reference level to the second sensing reference level to thereby reduce a precharge level of the bit lines.

5. The operating method of claim 4, wherein the second sensing reference level is set higher than the first sensing reference level.

6. The operating method of claim 4, wherein, when cells which are not erased are not detected when performing the first erase verification operation, the second erase verification operation is performed.

7. The operating method of claim 4, wherein, when cells which are not erased are not detected when performing the second erase verification operation, the erase operation is terminated.

8. The operating method of claim 4, wherein the erase voltage is increased every time the erase operation is repeatedly performed.

9. The operating method of claim 4, wherein the precharge level is determined in accordance with a result obtained by testing electrical deterioration of the memory cells based on an increase in a cycling frequency of the semiconductor device.

10. An operating method of a semiconductor device, comprising:
    applying an erase voltage to memory cells;
    performing an erase verification operation for detecting cells which are not erased on the basis of a first sensing reference level, with respect to each of memory cell groups associated with even or odd word lines or even or odd bit lines among the memory cells;
    performing an additional erase verification operation by changing the first sensing reference level to a second sensing reference level before performing the erase verification operation of a next memory cell group when cells which are not erased are detected when performing the erase verification operation;
    repeatedly performing the erase operation by increasing the erase voltage when cells which are not erased are detected when performing the additional erase verification operation; and
    terminating the erase operation when cells which are not erased are not detected from among the memory cell groups,
    wherein the additional erase verification operation is performed by increasing the first sensing reference level to the second sensing reference level to thereby reduce a precharge level of the even or odd bit lines.

11. The operating method of claim 10, wherein the second sensing reference level is set higher than the first sensing reference level.

12. The operating method of claim 10, wherein the erase voltage is increased every time the erase operation is repeatedly performed.

13. The operating method of claim 10, wherein the precharge level is determined in accordance with a result obtained by testing electrical deterioration of the memory cells based on an increase in a cycling frequency of the semiconductor device.

* * * * *